United States Patent [19]

Youn et al.

[11] Patent Number: 5,077,226
[45] Date of Patent: Dec. 31, 1991

[54] MANUFACTURING METHOD FOR BICMOS DEVICES

[75] Inventors: Jong M. Youn, Suweon; Gyu C. Kim, Seoul, both of Rep. of Korea

[73] Assignee: Samsung Electronics Co., Ltd., Suweon, Rep. of Korea

[21] Appl. No.: 692,713

[22] Filed: Apr. 29, 1991

[30] Foreign Application Priority Data

Feb. 28, 1991 [KR] Rep. of Korea .................. 91-3280

[51] Int. Cl.$^5$ ............................................. H01L 21/70
[52] U.S. Cl. .................................. 437/31; 437/47; 437/52; 437/59; 437/44
[58] Field of Search .................... 437/59, 47, 52; 148/DIG. 9; 365/180

[56] References Cited

U.S. PATENT DOCUMENTS

| | | | |
|---|---|---|---|
| 4,214,917 | 7/1980 | Clark et al. | 437/46 |
| 4,637,125 | 1/1987 | Iwasaki et al. | 437/59 |
| 4,921,811 | 5/1990 | Watanabe et al. | 437/59 |

FOREIGN PATENT DOCUMENTS

| | | | |
|---|---|---|---|
| 0150349 | 6/1989 | Japan | 437/59 |
| 0037765 | 2/1990 | Japan | 437/59 |

Primary Examiner—Olik Chaudhuri
Assistant Examiner—Long Pham
Attorney, Agent, or Firm—Ladas & Parry

[57] ABSTRACT

The present invention relates to a method for manufacturing BiCMOS device. The emitter of bipolar transistor and the load resistors of CMOS transistors are formed in such a manner that the amorphous silicon layer is formed at a low temperature in order to prevent an oxide layer from forming on the exposed base region and then the ion impurities are implanted into this region so as to be annealed and oxidized, where the ion impurities are not implanted into the load resistor portion. Thus, any oxide layer is scarcely formed between the emitter region and polysilicon layers. And the resistance becomes substantially low since the amorphous silicon layer is changed to the polysilicon layer with large grains and the emitter region is formed by diffusing the ion impurities.

In addition, the polysilicon layer for the load resistors of CMOS transistors is intrinsic and has large grain, thereby making the resistance value high. Accordingly, the present invention can improve the operating speed by the low emitter resistance of the bipolar transistor and can minimize the power consumption by the reduction of the leakage current due to the high load resistance of the CMOS transistors.

6 Claims, 5 Drawing Sheets

MANUFACTURING METHOD FOR BICMOS DEVICES

BACKGROUND OF THE INVENTION

The present invention relates generally to a manufacturing method for BiCMOS device, and more particularly to, a manufacturing method for BiCMOS device for static RAMs(Random Access Memories).

Generally, active components which compose logic gates in a semiconductor are divided into two types. One of them is bipolar transistor and the other is CMOS transistor. It is well known that CMOS transistor has a low power consumption and a high integration density, while bipolar transistor has a fast operation speed and high output driving capability.

In recent years, the degree of high performance characteristics of semiconductor integrated circuits has been improved significantly, and this trend is expected to continue in future. And, the degree of high performance is achieved by BiCMOS circuits, where CMOS transistors are used in logic circuits and bipolar transistors are used in peripheral circuits. BiCMOS device is widely used for such products as memory or gate array in Static Random Access Memory (SRAM). This BiCMOS SRAM can minimize the power consumption due to standby current by increasing the load resistance of CMOS cells and can also improve the operating speed by reducing the emitter resistance of bipolar transistor. Thus, BiCMOS SRAM can operate somewhat faster than CMOS SRAM at equivalent power and density for the same geometry, while maintaining the same power consumption and integration density, and thus its application range is extended gradually.

In a prior manufacturing method for BiCMOS SRAMs, a load resistor of a CMOS cell is made of undoped polysilicon layers in order to increase its resistance and an emitter region of bipolar transistor is formed by doped polysilicon layers in order to decrease the resistance. However, since the polysilicon layer is formed at a high temperature, an oxide layer is formed between the emitter region and the polysilicon layer and thus the emitter resistance of bipolar transistor is increased. Moreover, high resistance can not be obtained due to the limited resistance of the undoped polysilicon layers.

SUMMARY OF THE INVENTION

An object of the invention is to provide a manufacturing method for BiCMOS device in which emitter resistance can be efficiently reduced.

Another object of the invention is to provide a manufacturing method for BiCMOS device in which load resistance of CMOS transistors can be efficiently increased.

According to the invention, there is provided a manufacturing method for BiCMOS device which comprises the steps of implanting second concentration into a certain portion of a first conductivity semiconductor substrate, implanting first conductivity ion impurities of high concentration into a portion interposed between the regions implanted by the second conductivity ion impurities, forming first, second, and third regions by activating the implanted ion impurities, forming an epitaxial layer over the entire surface of the structure, forming first, second, and third wells on the first, second, and third regions, each being implanted by the same conductivity ion impurities with each region, forming a field oxide layer on the entire surface of the structure to define device regions, forming a second conductivity diffusion layer of high concentration on a predetermined portion of the first well, forming a gate oxide layer on the entire surface of the structure, forming a first polysilicon layer after removing the gate oxide layer from a predetermined portion of the second well, being used as an interconnection line and gates of the first and second MOS transistors on the second and third wells, forming a spacer at sidewalls of the first polysilicon layer, implanting the first conductivity ion impurities of high concentration to form a base contact region in the first well and to form source and drain regions of the first MOS transistor in the third well, implanting the first conductivity ion impurities of low concentration to form a base region in the first well, implanting the second conductivity ion impurities of high concentration at a predetermined portion of the second region, to form a source and a drain of the second MOS transistor diffusing the implanted ion impurities, exposing predetermined portions of the first polysilicon layer used for the interconnection line and the base region after forming an oxide layer on the entire surface of the structure, forming an amorphous silicon layer on the exposed portions of the first polysilicon layer and the base region, implanting ion impurities into the amorphous silicon layer except the predetermined portion of the first polysilicon layer, annealing and oxidizing the amorphous silicon layer to be converted to a second polysilicon layer and simultaneously forming an emitter region, forming a first metal electrode in such a manner that an oxide layer is formed on the entire surface of the structure and a predetermined region thereof is exposed, forming a second metal electrode in such a manner that an oxide layer is formed on the entire surface of the structure and the predetermined electrode of the first MOS transistor is exposed, and forming a protection layer on the entire surface of structure.

The foregoing and other objects, features and advantages of the invention will be apparent from the following more particular description of a preferred embodiment of the invention, as illustrated in the accompanying drawings.

BRIEF DESCRIPTION OF THE DRAWINGS

A better understanding of the invention may be obtained from a consideration of the detailed description hereinafter taken in conjunction with the drawings which are briefly described below.

DETAILED DESCRIPTION OF THE PREFERRED EMBODIMENT

The invention will now be described in more detail with reference to the accompanying drawings.

Figure 1A:
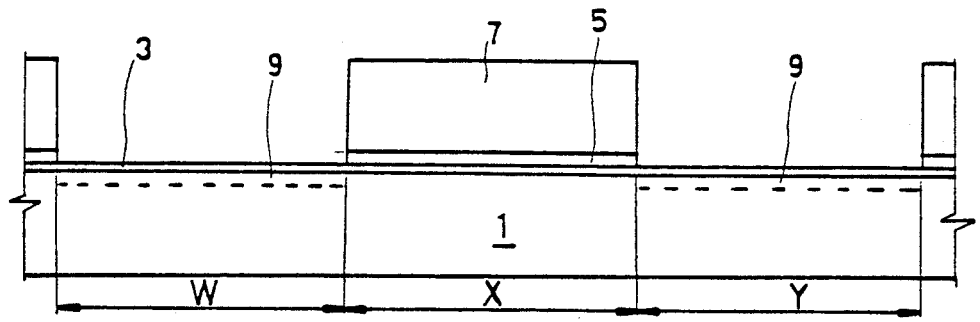
FIGS. 1(A)-1(K) are series of cross sectional views for explaining the manufacturing steps of BiCMOS device according to the present invention.
Figure 1B:
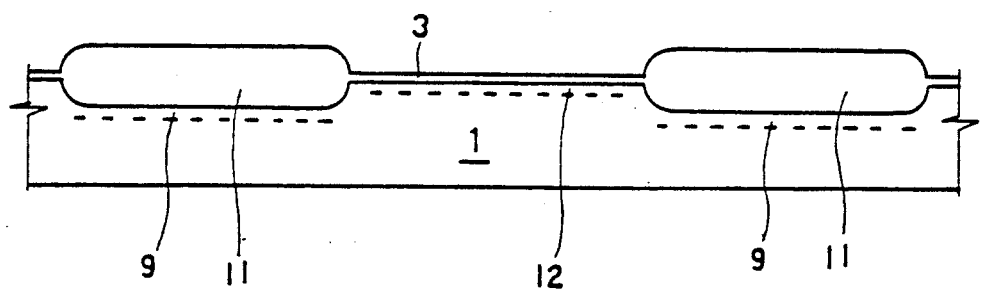
Figure 1C:
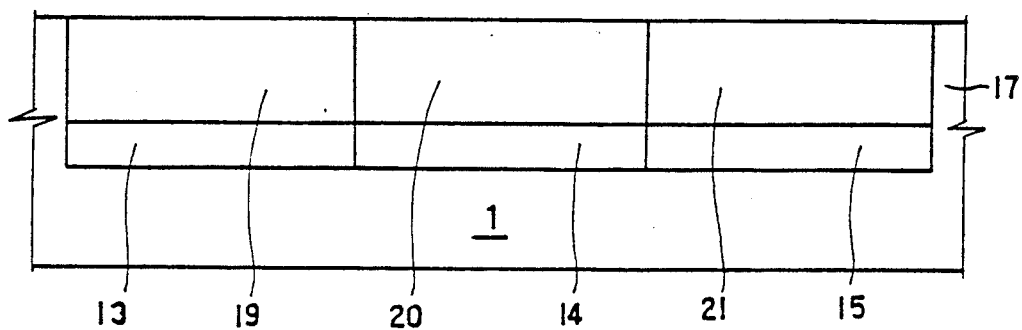
Figure 1D:
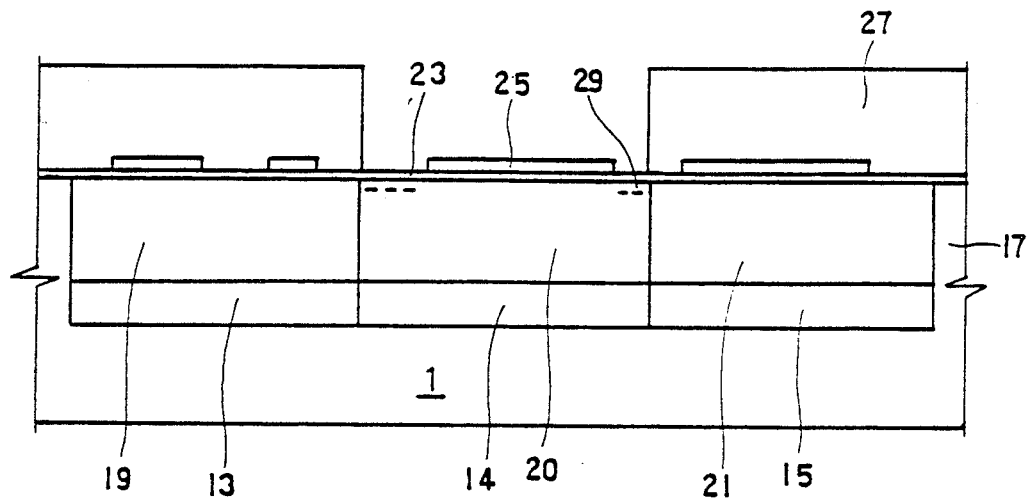
Figure 1E:
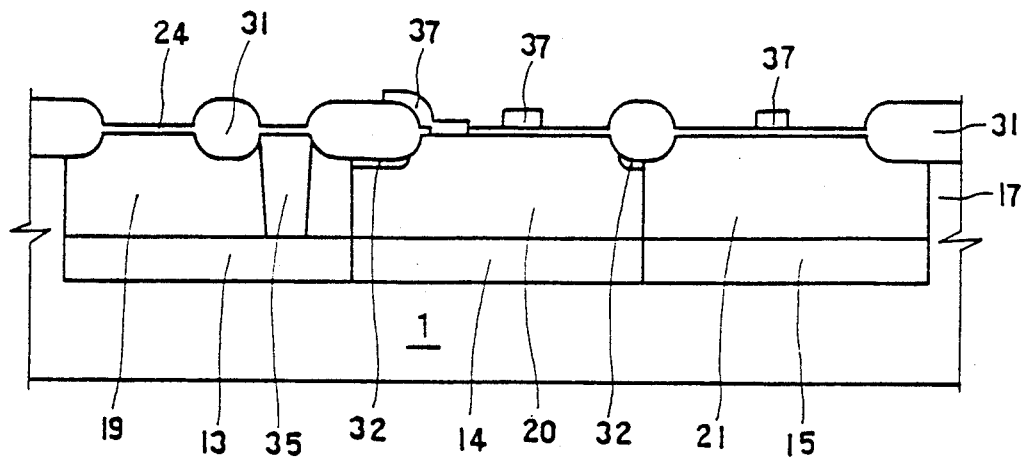
Figure 1F:
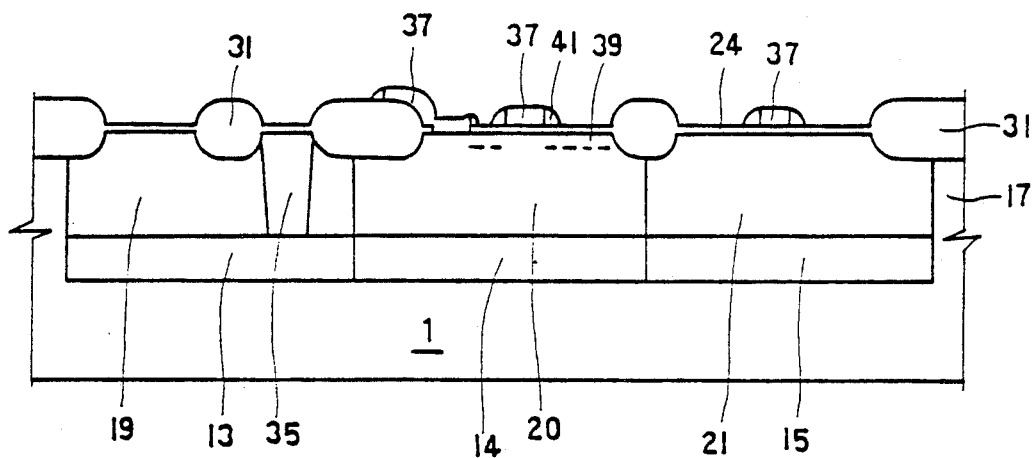
Figure 1G:
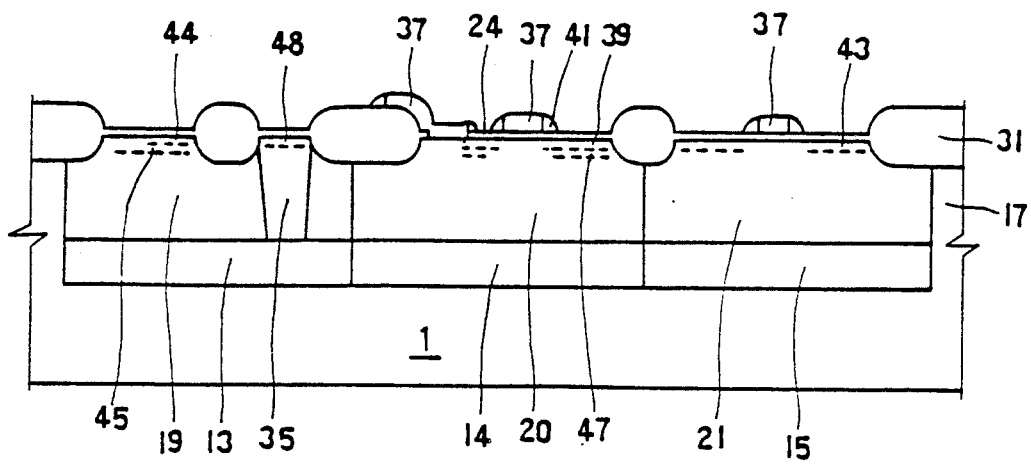

Referring to FIG.1(A), a first pad oxide layer 3, a first nitride layer 5 and a first photoresist layer 7 are sequentially formed on the surface of P-type substrate 1 with a {100} orientation and a resistivity of $2 \sim 20\Omega$. cm, and a portion of the first pad oxide layer 3 on bipolar transistor area W and PMOS transistor area Y is exposed by the lithography process and then N-type impurities such as arsenic are implanted with an energy of 100 keV and a dose of $10 \sim 10$ ions/cm² into the entire surface in order to form an ion implanted region 9.

Figure 1:
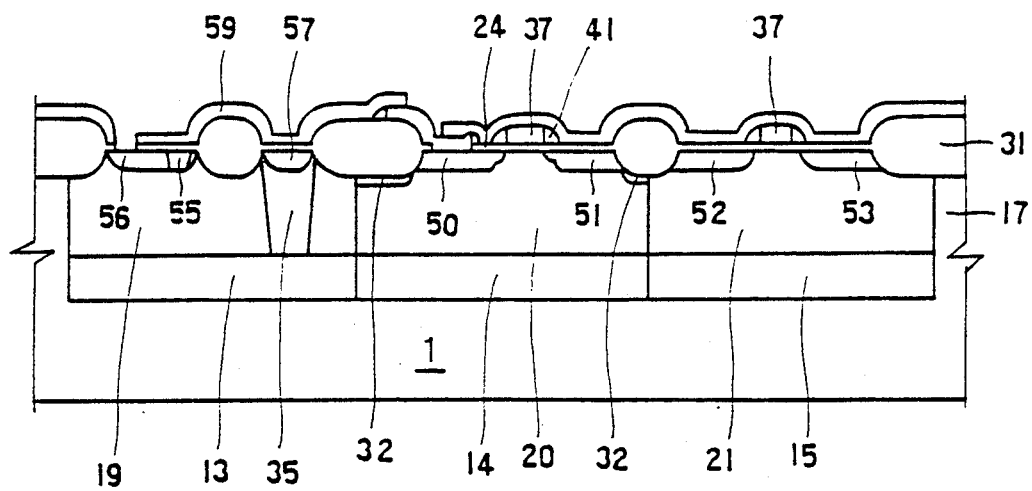
Figure 1:
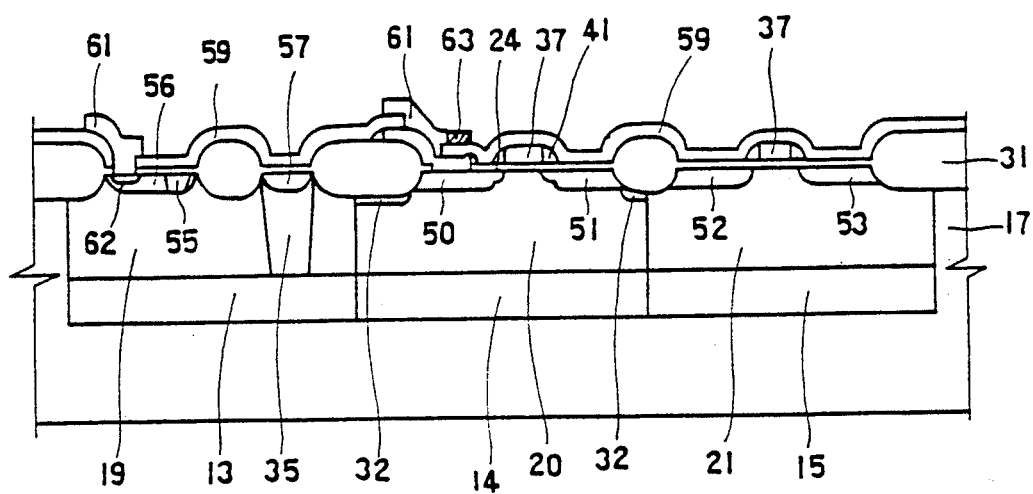
Figure 1:
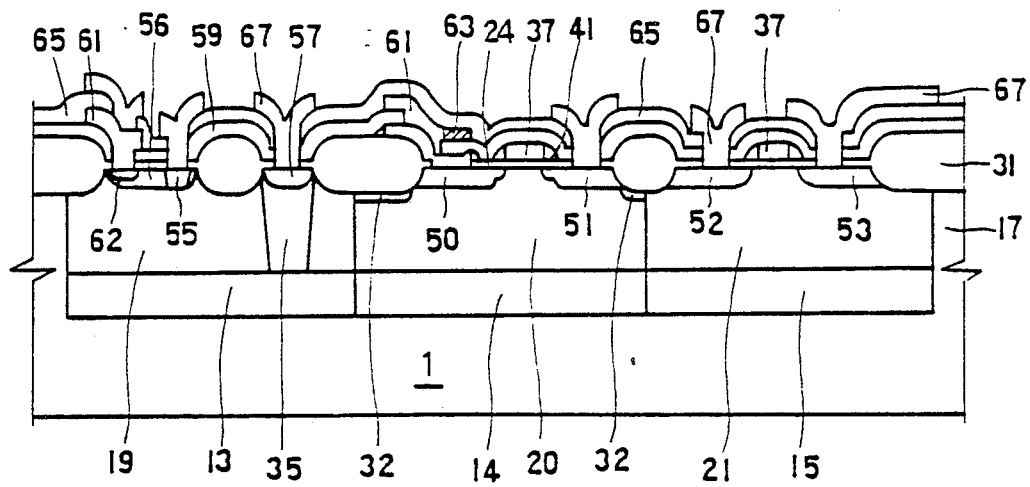
Figure 1:
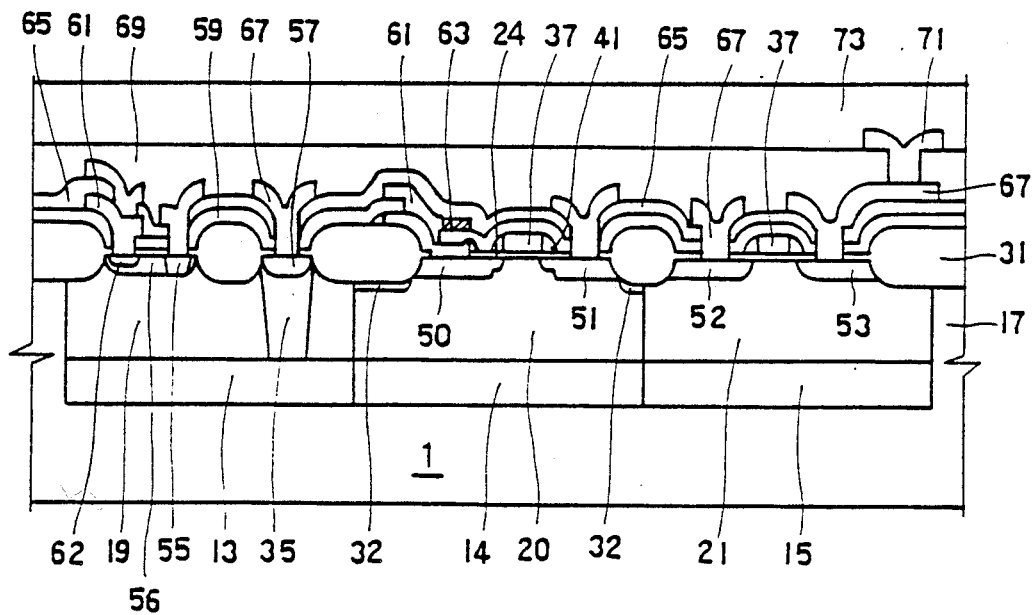

In FIG. 1 (B), after removing the first photoresist layer 7, the exposed portion of the first pad oxide layer 3 is grown to form a thick oxide layer 11 by using the first nitride layer 5 as a mask. Subsequently, after removing the first nitride layer 5, P-type impurities such as boron are implanted with an energy of 60 keV and a dose of $1 \times 10 \sim 3 \times 10$ ions/cm² into the entire surface to form an ion implanted region 12 at the surface of the NMOS transistor region Y.

In FIG. 1 (C), the ion impurities of the ion implanted regions 9 and 12 are diffused at $1000° \sim 1200°$ C. in $N_2$ ambient to form first, second, and third buried layers 13, 14, and 15. The first buried layer 13 is used to reduce the resistance of the collector of bipolar transistor, while the second and third buried collector layers 14 and 15 are used to prevent the latch-up of NMOS and PMOS transistors. Subsequently, after removing the oxide layers 3 and 11, an epitaxial layer 17 of $1.5 \sim 2$ μm in thickness is formed over the entire surface of the semiconductor substrate 1.

Next, first, second and third wells 19, 20, and 21 are respectively formed in the epitaxial layer 17 on the first, second, and third buried layers 13, 14 and 15 by the same method as that used to form the buried layers. At this point, the first and third wells 19 and 21 are formed by phosphorous implantation with an energy of $100 \sim 180$ keV and the dose of $1 \times 10 \sim 3 \times 10$ ions/cm², while the second well 20 is formed by boron implantation with an energy of $60 \sim 100$ keV and the dose of $1 \times 10 \sim 3 \times 10$ ions/cm², and then the implanted ion impurities are activated. Also, the first well 19 is used to form bipolar transistor and the second and third wells 20 and 21 are used to form NMOS and PMOS transistors, respectively.

In FIG. 1 (D), after forming a second pad oxide layer 23 and a second nitride layer 25 on the entire surface of structure described above, the second pad oxide layer formed on unwanted regions except for the device region is exposed by the conventional lithography process and then a second photoresist layer 27 is formed on the region except for the second well 20, where the NMOS transistor is to be made. Subsequently, P-type impurities such as boron are implanted with an energy of 30 keV and a dose of $1 \times 10 \sim 1 \times 10$ ions/cm² to form an ion implanted region 29.

In FIG. 1 (E), after removing the second photoresist layer 27, the exposed second pad oxide layer is grown to form a field oxide layer 31 by using the second nitride layer 25 as a mask and then the second nitride layer 25 is removed. In this case, the impurities of the ion implanted region 29 on the predetermined portion of the second well 20 is activated to form a channel stopper 32. N-type impurities such as phosphorous are implanted with an energy of 100 keV and a dose of $3 \times 10 \sim 5 \times 10$ ions/cm² into a predetermined portion of the first well 19. Subsequently, by activating the implanted impurities with the conventional thermal processing, a N+ diffusion layer 35 is formed to reduce the resistance of the collector region. Moreover, P-type impurities such as boron are implanted with an energy of 30 Kev and a dose of $1 \times 10 \sim 1 \times 10$ ions/cm² in order to control threshold voltages of the NMOS and PMOS transistors after removing the second pad oxide layer 23 and forming a gate oxide layer 24 of $200 \sim 300$Å in thickness.

Next, after exposing a predetermined portion of the second well 20 by etching the gate oxide layer 24, a first polysilicon layer 37 of $2000 \sim 3000$Å in thickness is formed by the conventional LPCVD(Low Pressure Chemical Vapor Deposition) method and subsequently $POCl_3$ is deposited to reduce the resistance of the first polysilicon layer 37 to about 20 Ω/□. In order to form each gate of the NMOS and PMOS transistors, the first polysilicon layer 37 is removed except for predetermined portions of the second and third wells 20 and 21. At this time, the first polysilicon layer 37 on a predetermined portion of the second well 20, on which the gate oxide layer 24 is not formed, is not removed to be used as an interconnection line.

In FIG. 1 (F), N-type impurities such as phosphorous are implanted with an energy of 30 KeV and a dose of $1 \times 10 \sim 1 \times 10$ ions/cm² into the entire surface of the second well 20 for forming an ion-implanted region 39 in order to form lightly doped source and drain of NMOS transistor, where the ion impurities are not implanted toward the bottom of the first polysilicon layer 37. At the lower portion of this first polysilicon layer 37 to be used as the interconnection line, the impurities such as phosphorous is deposited with high concentration during the deposition of $POCl_3$. Next, after forming the oxide layer on the entire surface of the structure by the CVD method, a spacer 41 is formed at the sidewalls of the first polysilicon layer 37 by the conventional dry etching method.

In FIG. 1 (G), P-type impurities such as $BF_2$ are implanted with an energy of 60 KeV and a dose of $3 \times 10 \sim 5 \times 10$ ions/cm² into the surface of the third well 21 to form an ion implanted region 43. At this time, another ion implanted region 44 is formed on a predetermined portion of the first well 19 to form a base contact region of bipolar transistor. Next, P-type impurities such as boron are implanted with an energy of 30 KeV and a dose of $1 \times 10 \sim 3 \times 10$ ions/cm² into the predetermined portion of the first well 19 so as to form an ion implanted region 45 which forms a base region of bipolar transistor. Subsequently, N-type impurities such as arsenic are implanted with an energy of 120 KeV and a dose of $3 \times 10 \sim 6 \times 10$ ions/cm² into the entire surface of the second well 20 so as to form an ion implanted region 47 which forms heavily doped source and drain regions of NMOS transistor. At this time, another ion implanted region 48 is also formed at the surface of the N+ diffusion region 35 to form a collector contact region of bipolar transistor.

In FIG. 1(H), a base region 56, a base contact region 55, a collector contact region 57 of bipolar transistor, source and drain regions 50 and 51 of NMOS transistor, source and drain regions 52 and 53 of PMOS transistor are respectively formed by activating the ion implanted regions 39, 43, 44, 45, 47 and 48. Next, after forming an oxide layer 59 on the entire surface of the structure by the conventional CVD method, a predetermined portion of the base region 56 is exposed, where the first polysilicon layer 37 to be used as the interconnection line is also exposed partially.

In FIG. 1(I), an amorphous silicon layer is formed on the exposed base region 56 and the first polysilicon region 37 at a low temperature of $500° \sim 540°$ C. In this case, since the amorphous silicon layer is formed at a low temperature, any oxide layer can be scarcely formed on the surface of the base region 56. Next, N-type impurities such as arsenic are implanted with an energy of 100 KeV and a dose of $1 \times 10 \sim 2 \times 10$ ions/cm² into the second polysilicon layer 61 except for a predetermined portion on the first polysilicon layer 37 and then the amorphous silicon layer is annealed to form a second polysilicon layer 61. On the upper part of the second polysilicon layer 61, the oxide layer is formed.

At this time, the doped impurities on the second polysilicon layer 61 is diffused to the base region 56 in order to form an emitter region 62. The second polysilicon layer 61, which serves as an emitter contact region, has a low resistance since its grain size is increased when the amorphous silicon is changed to the polysilicon and the impurities are doped. Thus, the intrinsic part of the second polysilicon layer 61, where the ion impurities are not implanted, is used as a load resistor 63 of SRAM having a high resistance value.

In FIG. 1 (J), after forming an oxide layer 65 on the entire surface of the structure by the conventional CVD method, predetermined portions of bipolar, NMOS, and PMOS transistors are exposed by the conventional lithography process. Next, a first metal electrode 67 such as aluminum is formed on the exposed part.

In FIG. 1 (K), after forming an oxide layer 69 on the entire surface of the structure, the first metal electrode 67 on PMOS transistor is exposed by the conventional lithography process. Next, a second metal electrode 71 is formed to be connected to the first metal electrode 67 and finally a protection layer 73 such as BPSG (Boro-Phospho-Silicate-Glass) is formed.

As mentioned up to now, the emitter of bipolar transistor and the load resistors of CMOS transistors are formed in such a manner that the amorphous silicon layer is formed at a low temperature in order to prevent an oxide layer from forming on the exposed base region and then the ion impurities are implanted into this region so as to be annealed and oxidized, where the ion impurities are not inplanted into the load resistor portion. Thus, any oxide layer is scarcely formed between the emitter region and polysilicon layers. And the resistance becomes substantially low since the amorphous silicon layer is changed to the polysilicon layer with large grains and the emitter region is formed by diffusing the ion impurities.

In addition, the polysilicon layer for the load resistors of CMOS transistors is intrinsic and has large grain, thereby making the resistance value high. Accordingly, the present invention can improve the operating speed by the low emitter resistance of bipolar transistor and can minimize the power consumption by reducing of the leakage current due to the high load resistance of CMOS transistors.

What is claimed is:

1. A manufacturing method for BiCMOS device, comprising the steps of:
    implanting second conductivity ion impurities of high concentration into a predetermined portion of a first conductivity semiconductor substrate;
    implanting the first conductivity ion impurities of high concentration into a portion interposed between the regions implanted by the second conductivity ion impurities;
    forming first, second, and third regions by activating the implanted impurities;
    forming an epitaxial layer on the entire surface of the structure;
    forming first, second, and third wells on the first, second, and third regions, each being implanted by the same conductivity ion impurities with each region;
    forming a field oxide layer on the entire surface of the structure to define device regions;
    forming a second conductivity diffusion layer of high concentration on a predetermined portion of the first well;
    forming a gate oxide layer on the entire surface of the structure;
    forming a first polysilicon layer after removing the gate oxide layer from a predetermined portion of the second well, being used as an interconnection line and gates of the first and second MOS transistors on the second and third wells;
    forming a spacer at sidewalls of the first polysilicon layer;
    implanting the first conductivity ion impurities of high concentration to form a base contact region in the first well and to form source and drain regions of the first MOS transistor in the third well;
    implanting the first conductivity ion impurities of low concentration to form a base region in the first well;
    implanting the second conductivity ion impurities of high concentration at a predetermined form a source and a drain of the second MOS transistor;
    diffusing the implanted ion impurities;
    exposing predetermined portions of the first polysilicon layer used for the interconnection line and the base region after forming an oxide layer on the entire surface of the structure;
    forming an amorphous silicon layer on the exposed portions of the first polysilicon layer and the base region;
    implanting ion impurities into the amorphous silicon layer except the predetermined prortion of the first polysilicon layer;
    annealing and oxidizing the amorphous silicon layer to be converted to a second polysilicon layer and simultaneously forming an emitter region;
    forming a first metal electrode in such a manner that an oxide layer is formed on the entire surface of the structure and a predetermined region thereof is exposed;
    forming a second metal electrode in such a manner that an oxide layer is formed on the entire surface of the structure and the predetermined electrode of the first MOS transistor is exposed; and
    forming a protection layer on the entire surface of structure.

2. A method for manufacturing BiCMOS device according to claim 1, wherein the first polysilicon layer is doped with the first conductivity ion impurities.

3. A method for manufacturing BiCMOS device according to claim 2, wherein the region where the gate oxide layer is not formed is heavily doped when the first conductivity ion impurities are implanted.

4. A method for manufacturing BiCMOS device according to claim 1, wherein the first conductivity ion impurities are lightly implanted before forming the spacer.

5. A method for manufacturing BiCMOS device according to claim 1, wherein the second conductivity diffusion region on the first well is implanted at the same time when the second conductivity ion impurities are heavily implanted to form the source and drain regions of the second MOS transistor.

6. A method for manufacturing BiCMOS device according to claim 1, wherein the second polysilicon layer on the base region is to be an emitter region.

* * * * *